United States Patent
Aizaki

[11] Patent Number: 6,091,202
[45] Date of Patent: *Jul. 18, 2000

[54] ELECTRON BEAM EXPOSURE APPARATUS WITH NON-ORTHOGONAL ELECTRON EMITTING ELEMENT MATRIX

[75] Inventor: Naoaki Aizaki, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/743,219

[22] Filed: Nov. 5, 1996

[30] Foreign Application Priority Data

Dec. 21, 1995 [JP] Japan ..................................... 7-333094

[51] Int. Cl.$^7$ ................................ H01J 1/16; H01J 19/10
[52] U.S. Cl. ....................... 315/169.1; 315/334; 313/336
[58] Field of Search ................................ 315/169.1, 334; 313/496, 497, 297, 298, 304, 329, 336; 250/492.2, 492.22

[56] References Cited

U.S. PATENT DOCUMENTS

| | | | |
|---|---|---|---|
| 4,438,557 | 3/1984 | Parker et al. | 250/492.22 |
| 5,070,282 | 12/1991 | Epsztein | 313/336 |
| 5,144,142 | 9/1992 | Fueki et al. | 250/492.22 |
| 5,191,217 | 3/1993 | Kane et al. | 313/336 |
| 5,363,021 | 11/1994 | MacDonald | 313/336 |
| 5,391,956 | 2/1995 | Watanabe et al. | 313/336 |
| 5,587,627 | 12/1996 | Saito et al. | 315/169.1 |
| 5,637,951 | 6/1997 | Parker | 315/169.1 |
| 5,682,078 | 10/1997 | Shishido | 313/336 |
| 5,763,987 | 6/1998 | Morikawa | 313/336 |
| 5,786,656 | 7/1998 | Hasegawa et al. | 313/336 |

FOREIGN PATENT DOCUMENTS

| | | |
|---|---|---|
| 57-187849 | 11/1982 | Japan . |
| 5-251315 | 9/1993 | Japan . |
| 6-181172 | 6/1994 | Japan . |
| 7-153655 | 6/1995 | Japan . |

OTHER PUBLICATIONS

M. Heritage, "Electron–projection microfabrication system", J. Vac. Sci. Technol., Nov.–Dec. 1975, vol. 12, No. 6, pp. 1135–1140.

T. Chang et al., "Arrayed miniature electron beam columns for high throughput sub–100 nm lithography", J. Vac. Sci. Technol., Nov.–Dec. 1992, vol. 10, No. 6, pp. 2743–2748.

*Primary Examiner*—Michael B Shingleton

[57] ABSTRACT

An electron beam exposure apparatus, comprising an electron emitting apparatus including an extracting electrode and a plurality of electron emitting elements having end portions exposed individually in a plurality of openings formed in rows and columns on a principal face of the extracting electrode, a control power supply for applying a voltage between the extracting electrode and selected ones of the electron emitting elements to emit electrons from the selected electron emitting elements, an acceleration electrode in the form of a flat plate having a number of very small openings equal to the number of and corresponding to the electron emitting elements, and a converging electrode in the form of a flat plate having a number of very small openings equal to the number of and corresponding to the electron emitting elements.

14 Claims, 4 Drawing Sheets

ELECTRON BEAM EXPOSURE APPARATUS WITH NON-ORTHOGONAL ELECTRON EMITTING ELEMENT MATRIX

BACKGROUND OF THE INVENTION

1. Field of the Invention

This invention relates to an electron beam exposure apparatus, and more particularly to an electron beam exposure apparatus for use to manufacture an integrated circuit of a semiconductor device or a mask for the formation of an integrated circuit.

2. Description of the Related Art

In recent years, much effort has been and is being directed to reduction of the dimensions of elements of a semiconductor integrated circuit in order to raise the density and the speed of operation of the semiconductor integrated circuit. In order to reduce the device dimensions, research and development for an optical exposure apparatus which makes use of ultraviolet rays have been directed to reduction in wavelength of light used, increase in NA (numerical aperture) of the lens, optical improvement of the exposure apparatus such as employment of a deformed shape light source, application of an exposure method of a new technique which employs a phase shift mask or a like element, and so forth.

Further, in parallel with such improvement of the optical exposure technique, development of new exposure methods such as electron beam exposure or X-ray exposure has proceeded. Particularly, various attempts employing electron beam exposure have been proposed for the formation of an integrated circuit having a fine pattern such as a 256 megabit DRAM.

While those electron beam exposure apparatus are classified into two types including a point beam type and a variable rectangular beam type, they both require a long period of time for exposure because a pattern is divided into unit small areas or rectangular areas and either a point beam is deflected to successively scan the unit small areas or an electron beam having a beam spot of a size corresponding to the pattern is deflected to draw the pattern with one stroke. For example, for a 256 megabit DRAM mentioned above, the exposure time required for one chip is approximately 10 minutes, which is longer by approximately 100 times or more than that required with an exposure apparatus of the optical exposure type. Further, the electron beam exposure apparatus are disadvantageous also in that they are more expensive than optical exposure apparatus.

Meanwhile, M. B. Heritage has published a report entitled "Electron-projection microfabrication system", J. Vac. Sci. Technol., Vol. 12, No. 6, November/December 1975, pp.1135–1140. The report discloses a system wherein, preparing a mask having a pattern corresponding to an entire memory chip, the entire chip is exposed by a single electron beam irradiation operation in order to reduce the exposure time mentioned above.

The system just described, however, has not been put into practical use as yet due to difficulty in implementation of an electron optical system for a large area electron beam which assures a sufficiently high degree of accuracy over the entire area of a chip of more than several millimeter square.

Meanwhile, another electron beam exposure apparatus is disclosed in Japanese Patent Laid-Open Application No. Showa 52-119185 wherein a mask having several patterns formed at different block positions thereon is provided on a path of an electron beam and deflection means is provided for selecting, on the mask, an electron beam of a diameter sufficient to allow each block to be irradiated by the electron beam. Further, an electronic optical system is disclosed in a report No. 27a-K-6 by T. Matsuzaka et al., "Study of EB cell Projection Lithography (1): Electron Optics", Extended Abstracts for the 50th Autumn Meeting of the Japan Society of Applied Physics in September, 1989, p.452, wherein a plurality of openings are provided for a second aperture while the output of a shaping deflector is increased in magnitude and a variable magnification lens as well as a fly-back deflector are provided. Furthermore, it is disclosed in another report No. 27a-K-7 by Y. Nakayama et al., "Study of EB cell Projection Lithography (II): Fabrication of Si aperture", appearing on the same page of the same publication that an aperture is formed from single crystal of Si for EB cell projection lithography and anisotropic wet etching is used for the formation of a Si thin film part of the aperture while dry etching is used for working of an opening of the aperture. Those techniques all relate to a method of transferring a pattern having some repetitions not to an entire area but to a portion of an area of a chip, and contemplates reduction of the exposure time by preparing, as a mask, a partial region of a size approximately corresponding to a beam spot having a size sufficient to assure a uniform electron flow density from within a periodical pattern group of a chip.

However, while those electron beam exposure apparatus of the partial collective transfer type are effective for a semiconductor device which includes a comparatively large number of repetitive patterns such as a DRAM, they are disadvantageous in that, where they are used to manufacture a semiconductor device having ordinary logic circuits having a comparatively small number of repetitive patterns, a long exposure time is required similarly as in the system described hereinabove wherein an electron beam is deflected to draw a pattern with one stroke.

Further, T. H. P. Chang et al. have published a report entitled "Arrayed miniature electron beam columns for high throughput sub-100 nm lithography", J. Vac. Sci. Technol., B10(6), November/December 1992, pp.2743–2748. The report proposes a system wherein, in order to reduce the exposure time described above, a substrate on which a large number of electron optical microcolumns arranged in a matrix of rows and columns are formed is prepared and used for simultaneous exposure at positions corresponding to the electron optical microcolumns by a single electron beam irradiation operation. Besides, according to the technique, if electron beam control signals corresponding to different pattern data are supplied to the individual microcolumns electron optical microcolumns each including a very small electron lens and a very small deflection system, then exposure with an arbitrary pattern can be performed at a high speed irrespective of whether or not a repetitive pattern is included.

With the technique just described, however, a very small electron lens, a very small deflection system and other elements must be formed in each of the electron optical microcolumns, and it is difficult to form those very small structures, particularly, the very small deflection systems, with sufficient degrees of working accuracy and uniformity. Accordingly, the technique is disadvantageous in that, since the accuracy in position of the electron beams by deflection is low, the accuracy in pattern formation on a specimen is low and the apparatus cost is high.

A different electron beam exposure apparatus is disclosed in Japanese Patent Laid-Open Application No. Showa 56-98827 which includes a cold cathode electron beam generator having a structure wherein electron beam generation elements are arranged one- or two-dimensionally. In the exposure apparatus, a large number of cold cathode electron beams are generated simultaneously from the electron beam generator and are accelerated by an acceleration electrode, and then a one- or two-dimensional pattern of the electron beams is projected generally in a reduced or expanded scale on a specimen by a converging lens. By increasing the number of very small spots which can be exposed simultaneously and controlling the electron beam generation elements corresponding to the respective very small spots individually in this manner, reduction of the exposure time can be achieved irrespective of whether or not a repetitive pattern is included.

In the electron beam exposure apparatus disclosed in the last-mentioned document, however, since electron beams from those of the electron beam generation elements which are located at peripheral positions of the electron beam generator correspond to positions outside an optical axis of the electron optical system, that is, since those electron beams are positioned in a spaced relationship away from the center axis of the electron optical system in one direction, they exhibit comparatively large aberrations such as coma or astigmatism. Consequently, the electron beam exposure apparatus is disadvantageous in that the accuracy in shape of a pattern on a specimen is low. Even if an electron optical system having a high degree of accuracy is used in order to eliminate the disadvantage, the accuracy in pattern shape cannot be raised to such a high level that the pattern can be practically used. Further, since electron optical columns of a scale having a height of approximately 1 m are required similarly as in conventional apparatus, the electron beam exposure apparatus is disadvantageous also in that a high cost is required.

SUMMARY OF THE INVENTION

Accordingly, it is an object of the present invention to provide an inexpensive and practically usable electron beam exposure apparatus by which a pattern to be drawn can be transferred with a high degree of accuracy by an exposure operation of a short time even if the pattern does not include a repetitive pattern but includes various patterns.

According to the present invention, there is provided an electron beam exposure apparatus, comprising an electron emitting apparatus including a extracting electrode in the form of a flat plate and a plurality of electron emitting elements having end portions exposed individually in a plurality of openings formed in rows and columns on a principal face of the extracting electrode, a control power supply for applying a voltage between the lead electrode and selected ones of the electron emitting elements so that electrons are emitted independently of each other from the selected electron emitting elements, an acceleration electrode in the form of a flat plate having a number of very small openings equal to the number of and corresponding to the electron emitting elements for accelerating the emitted electrons, and a converging electrode in the form of a flat plate having a number of very small openings equal to the number of and corresponding to the electron emitting elements for converging electron beams formed from the accelerated electrons.

Preferably, the control power supply includes a plurality of application power supplies individually corresponding to the plurality of electron emitting elements, and voltages are applied from selected ones of the application power supplies to the selected ones of the electron emitting elements.

Preferably, the acceleration electrode in the form of a plate in which the very small openings through which electron beams pass are formed is disposed in parallel to the extracting electrode.

DETAILED DESCRIPTION OF THE PREFERRED EMBODIMENT

The present invention will be described below with reference to the drawings.

Figure 1A:
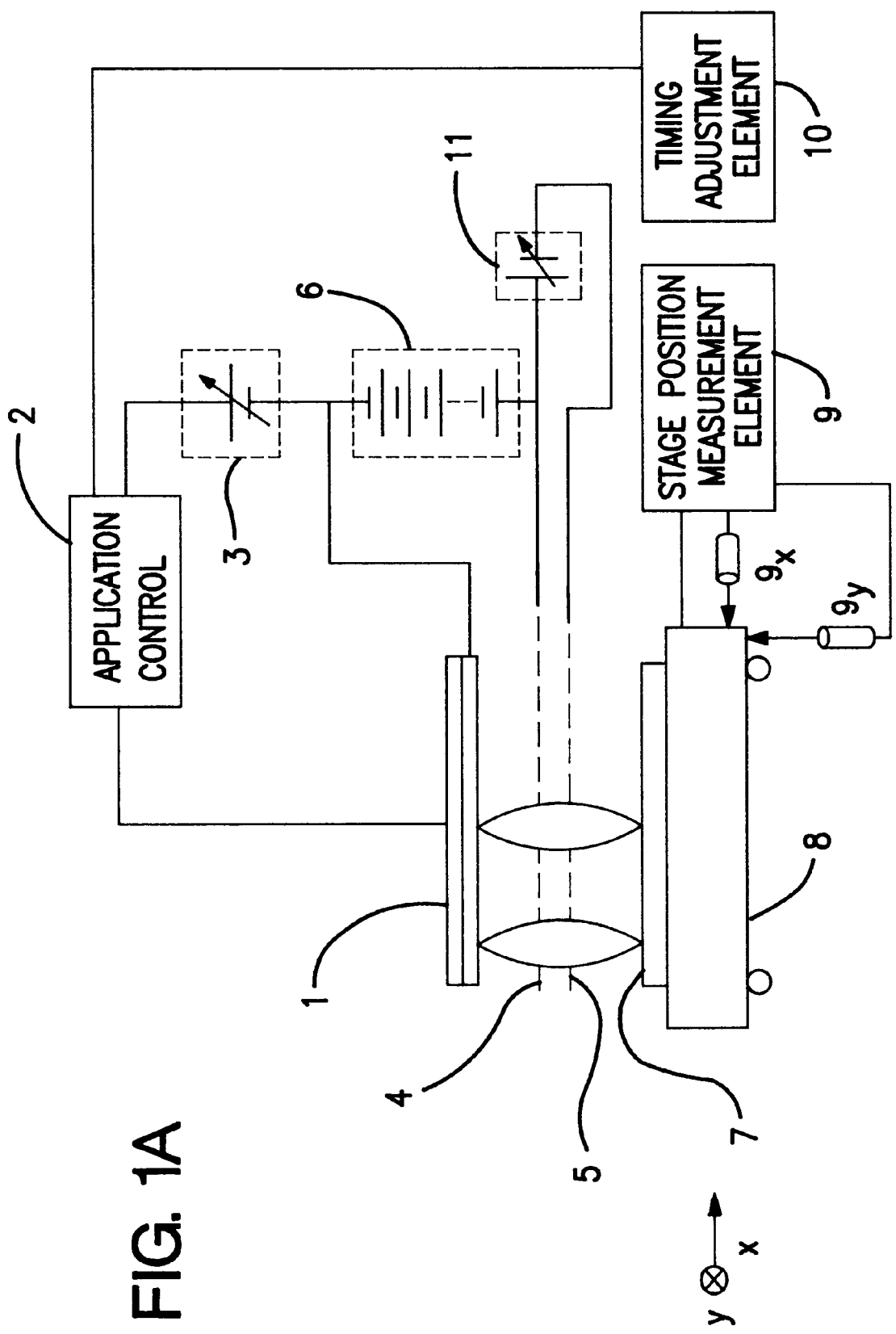
FIG. 1(A) is a block diagram showing a construction of an embodiment of an electron beam exposure apparatus of the present invention.
Figure 1B:
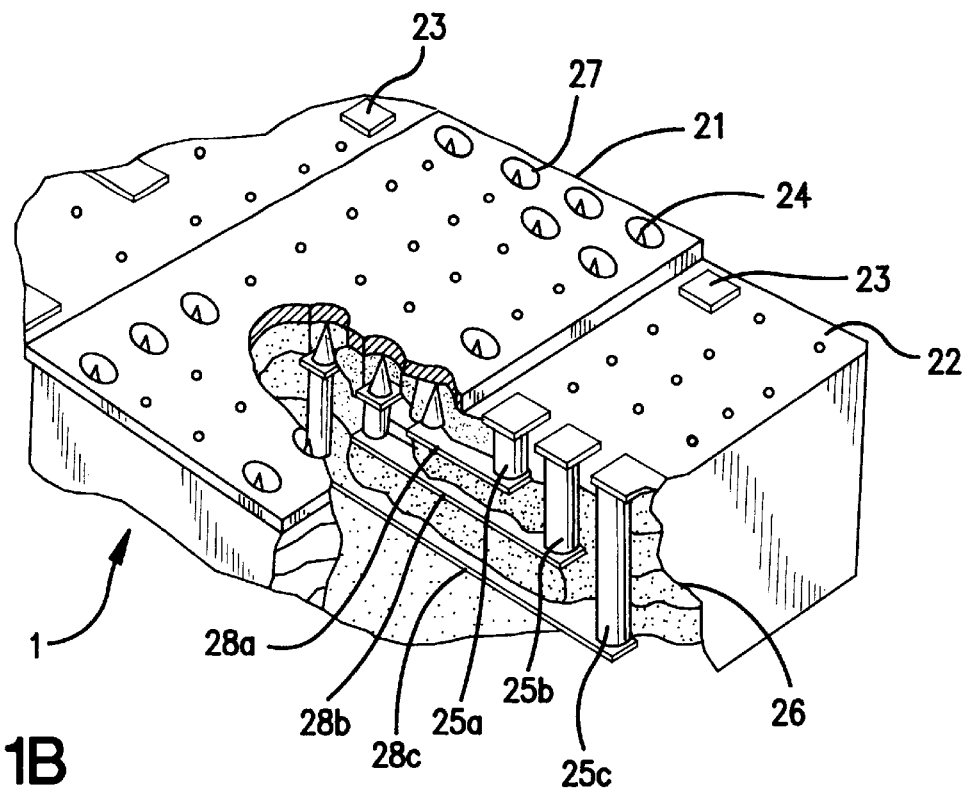
FIG. 1(B) is a perspective view, partially broken, of an electron beam emitting apparatus of the electron beam exposure apparatus shown in FIG. 1(A)

FIGS. 1(A) and 1(B) are a block diagram showing a construction of an electron beam exposure apparatus in an embodiment of the present invention and a perspective view, partially broken, of an electron beam discharging apparatus of the electron beam exposure apparatus. Referring to FIGS. 1(A) and 1(B), the electron beam exposure apparatus shown includes an electron emitting apparatus 1 including an extracting electrode 21 in the form of a flat plate and a plurality of electron emitting elements 24 having end portions exposed individually to a plurality of openings 27 formed in a matrix of rows and columns in the lead electrode 21, an application power supply 3 and an application controller 2 for applying a voltage between arbitrarily selected ones of the electron emitting elements 24 and the extracting electrode 21 to cause those electron emitting elements 24 to emit electrons therefrom independently of each other, an acceleration electrode 4 for accelerating the thus emitted electrons, a converging electrode 5 for converging the accelerated electrons, a high voltage power supply 6 for applying a high voltage potential difference between the acceleration electrode 4 and the electron emitting apparatus 1, a bias power supply 11 for applying a convergence voltage for the acceleration electrode 4 to the converging electrode 5, a stage 8 disposed in an opposing relationship to the extracting electrode 21 for carrying and moving a specimen 7 in X and Y directions, a stage position measurement element 9 for continuously measuring the position of the stage 8, and a timing adjustment element 10 for adjusting the timing of a signal to the application controller 2 in response to measurement data from the stage position measurement element 9.

Electron emitting apparatus 1 includes a plurality of electron emitting elements 24 buried in insulation layers 26 and having end portions exposed in openings 27 formed in a matrix of rows and columns in the plane of the extracting electrode 21 in the form of a plate as seen in FIG. 1(B).

In order to form an electric field between the electron emitting elements 24 and the extracting electrode 21, the electron emitting elements 24 are individually connected to a plurality of pads 23 of a construction body 22 on the outer side of extracting electrode 21 via wiring lines 28a, 28b, 28c, . . . and contacts 25a, 25b, 25c, . . . Those pads 23 are connected to the application controller 2 shown in FIG. 1(A) by a wire cable (not shown). The application controller 2 stores position coordinates of the electron emitting elements 24 to which a voltage is to be applied. The position coordinates stored in the application controller 2 are read out, and a voltage is applied to those electron emitting elements 24 positioned at the position coordinates in response to a timing signal from timing adjustment element 10 shown in FIG. 1(A) by the application power supply 3. From those electron emitting elements 24 to which the voltage is applied in this manner, electrons are emitted by the electric field.

Although the acceleration electrode 4 and the converging electrode 5 are not shown in FIG. 1(B) because they complicate the illustration, the acceleration electrode 4 is an electrode in the form of a flat plate provided in parallel to the extracting electrode 21 of the electron emitting apparatus 1 and disposed at a position spaced away by 4 mm from the extracting electrode 21. Also the converging electrode 5 is an electrode in the form of a flat plate provided in parallel to the acceleration electrode 4 and the extracting electrode 21 and disposed at a location spaced by 1 mm from the acceleration electrode 4. Electrons emitted from the electron emitting elements 24 described above are accelerated by the acceleration electrode 4 and then converged by the converging electrode 5 so that they are irradiated as spot images on the surface of the specimen 7.

It is to be noted that, in the present embodiment, the openings 27 have a diameter of 0.5 $\mu$m and are arranged in rows and columns at a pitch of 1.0 $\mu$m in order to obtain a high resolution. Further, the voltage to the converging electrode 5 is adjusted so that electrons emitted from one electron emitting element 24 may be irradiated as a spot image of a diameter of 0.025 $\mu$m on the surface of the specimen 7.

Further, the electron emitting elements 24 are arrayed in a 100×40 matrix. The axis of the arrangement of 100 elements of the array is not orthogonal but is inclined a little with respect to the axis of the arrangement of 40 elements of the array such that the projection positions on the axis of the arrangement of 100 elements may be spaced from each other by a distance of 0.025 $\mu$m. Consequently, if the stage 8 is moved in a direction orthogonal to the axis of the arrangement of 100 elements of the array of the electron emitting elements 24 while a voltage is applied periodically to the electron emitting elements 24, then electrons are irradiated as 40×100 spots, that is, 4,000 spots, at equal distances of 0.025 $\mu$m individually in lines between the width of the arrangement of 100 elements, that is, within the width of 100 $\mu$m. Consequently, the overall width of 100 $\mu$m is irradiated upon by the spots.

Further, predetermined timing adjustment is performed during such irradiation so that a region of the width of 100 $\mu$m can be processed by a single-travel of the stage 8 irrespective of a pattern shape or arrangement on the specimen 7. As a test, electron beams from the electron emitting elements 24 were irradiated upon the specimen 7 having a resist of a sensitivity of 10 $\mu$C/cm$^2$ applied thereto in such conditions that a voltage of 10.6 V was applied between the electron emitting elements 24 and the lead electrode 21, an acceleration voltage of 30 kV was applied to the acceleration electrode 4, a voltage of 20 kV was applied from the bias power supply 11 to the converging electrode 5, and the stage 8 was moved at a speed of 20 mm/sec. A result of the test proved that a good transfer pattern was successfully transferred with a voltage application time, that is, an exposure time, of 0.5 $\mu$sec for each irradiation spot.

Preferably, a number of application power supplies 3 equal to the number of the electron emitting elements 24 are provided so that voltages may be applied at suitable timings to the plurality of electron emitting elements 24. Further, in order to eliminate a possible delay caused by a wiring length or a switching operation and eliminate a dispersion in emitted electron amount caused by a dispersion in characteristic among electron emitting elements 24, the application voltages of the individual power supplies are adjusted in units of 0.001 V. By this countermeasure, the dispersion in emitted electron amount among electron emitting elements 24 is reduced to 1% or less, resulting in elimination of non-uniform transfer of a pattern.

Electron emitting apparatus 1 can emit electrons with the comparatively low application voltage of 10.6 V to sensitize the resist as described above. Here, in order to allow sensitization of a resist of a lower sensitivity or allow direct working of the specimen 7, the high voltage power supply 6 was constructed so that the output voltage thereof might be variable from 10 kV to 50 kV. Also the application power supply 3 was constructed so that the output voltage thereof might be set to several tens volts lower than an allowable voltage value so as to obtain electron beams of a higher energy Electron emitting apparatus 1 shown in FIG. 1(B) can be manufactured using an ordinary manufacturing process for a semiconductor integrated circuit.

In particular, a step of forming a wiring line 28a, 28b, 28c, . . . for interconnecting an electron emitting element 24 and a pad 23 at a predetermined depth and burying them with an insulation layer 26 is repeated by a number of times equal to a required number of layers, and then, the contacts 25a, 25b, 25c, . . . are formed corresponding to the positions of the electron emitting elements 24 and the positions of the pads 23, respectively. Then, in the present embodiment, an oxide silicon film of a film thickness of 0.5 $\mu$m is formed on the surface of the construction body 22 formed from the insulation layers 26 formed one on another. Further, a tungsten film of a film thickness of 0.35 $\mu$m is formed over the entire area of the oxide silicon film, and the tungsten film and the oxide silicon film are selectively removed by etching using lithography to form the openings 27 of a diameter of 0.5 $\mu$m in a region in which electron emitting elements are to be formed. Then, an aluminum film of 0.15 $\mu$m thick is formed on wiring lines or contact faces exposed through the openings 27, and a molybdenum film of 0.8 $\mu$m thick is formed by metal vapor deposition. During the vapor deposition, as the vapor deposition proceeds, the opening areas of the openings gradually decrease, and consequently, end portions of the molybdenum film formed by the deposition exhibit conical shapes. Using this phenomenon, the electron emitting elements 24 having pointed end portions having an optimum shape as a cathode are obtained.

Thereafter, the aluminum film is removed by wet etching. Thereupon, the molybdenum film applied except that on the electron emitting elements 24 it is all removed by lifting off. Then, the tungsten film on the surface of the construction body 22 is selectively removed by etching using lithography to form the pads 23. Those pads 23 are larger than the openings 27 and as large as 80 $\mu$m square. Accordingly, although the pads 23 are shown positioned on the opposite sides of the extracting electrode 21 in FIG. 1(B), where a sufficient space is not assured on the surface, the pads 23 are formed also on side faces of the construction body 22. To the pads 23 formed in this manner, fine metal lines are connected using a wire bonding apparatus and led out as a connection cable, which is connected to the application controller 2 shown in FIG. 1(A).

Figure 2:
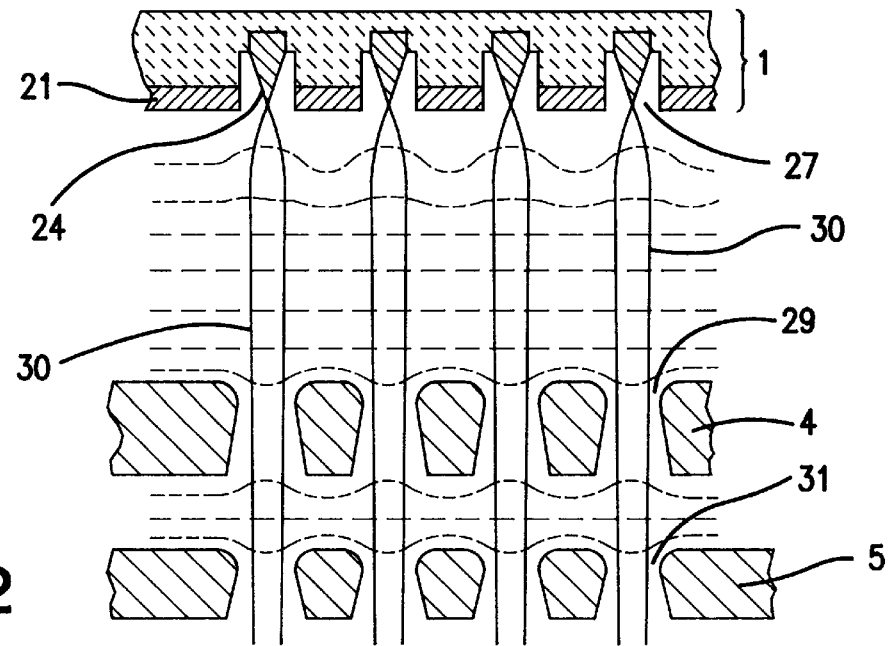
FIG. 2 is a schematic sectional view showing acceleration electrodes and associated elements therearound.

FIG. 2 is a sectional view showing details of the acceleration electrode 4 and associated elements therearound. The acceleration electrode 4 is a plate member in the form of a conductive flat plate disposed in parallel to the extracting electrode 21 and having an area larger than the extracting electrode 21, and holes 29 having a size substantially equal to or a little larger than the openings 27 are formed at positions of a central portion of the plate member opposing to the electron emitting elements 24. Further, though not shown in the drawings, a Wehnelt electrode in the form of a flat plate is provided preferably around the electron emitting apparatus 1 in order to make the electric field uniform. Furthermore, the Wehnelt electrode is located a little nearer to the acceleration electrode 4 side away from the extracting electrode 21 and a potential higher than the potential of the extracting electrode 21 is applied to the Wehnelt electrode so that the Wehnelt electrode may act as a second extracting electrode in order to allow electrons emitted from the electron emitting elements 24 to be extracted with a high efficiency. It is to be noted that, in FIG. 2, equipotential lines are indicated by broken lines.

Also the acceleration electrode 4 in the form of a mesh can be manufactured using an ordinary semiconductor manufacturing technique. In the present embodiment, for example, in a stainless steel plate polished thin at a central portion thereof by electrolytic polishing, the holes 29 are formed so as to have openings of 1 $\mu$m or less using a photo-etching technique. Then, since the holes 29 formed by the etching are naturally formed in a tapered configuration, acceleration electrode 4 is disposed such that a smaller diameter side of each of the holes 29 is opposed to the electron emitting apparatus 1.

In this manner, the alignment between the acceleration electrode 4 having the large number of holes 29 and the electron emitting apparatus 1 is established by operating a position fine movement mechanism (not shown) for receiving a frame on which outer sides of acceleration electrode 4 are held and finely moving the frame in the X and Y directions so that the openings 27 and the holes 29 may be aligned with each other under the observation of an optical microscope, placing a Faraday cup under the acceleration electrode 4 and adjusting the position fine movement mechanism so that a maximum beam electric current may be obtained. After the position of the acceleration electrode 4 is adjusted in this manner, it is used always in a fixed voltage condition so that the accuracy may be maintained.

The structure of the converging electrode 5 in the form of a flat plate in which a plurality of holes 31 through which electron beams 30 pass are formed is similar to that of the acceleration electrode 4 described above and is manufactured by a similar manufacture method. The bias power supply 11 is provided on the converging electrode 5 so that an appropriate bias voltage may be applied to the acceleration electrode 4. The adjustment of the bias voltage is performed such that the electron emitting apparatus 1, acceleration electrode 4 and converging electrode 5 are held as a unitary member and moved in a fixed direction while the application controller 2 is operated so as to emit electrons from the electron emitting elements 24. In this instance, the bias voltage to be applied to the converging electrode 5 should be successively varied within a necessary range while a result of drawing on a straight line obtained on a specimen is observed to determine a bias voltage condition in which the line width of 0.025 $\mu$m is obtained. After the bias voltage to the converging electrode 5 is adjusted in this manner, the converging electrode 5 is used always in a fixed voltage condition so that the accuracy may be maintained.

It is to be noted that each of the acceleration electrode 4 and the converging electrode 5 is formed from a stainless steel plate of 1 mm thick, and the entire construction including electron emitting apparatus 1 remains within the height of 20 mm on the specimen, and a compact structure having a high degree of safety can be achieved.

Figure 3:
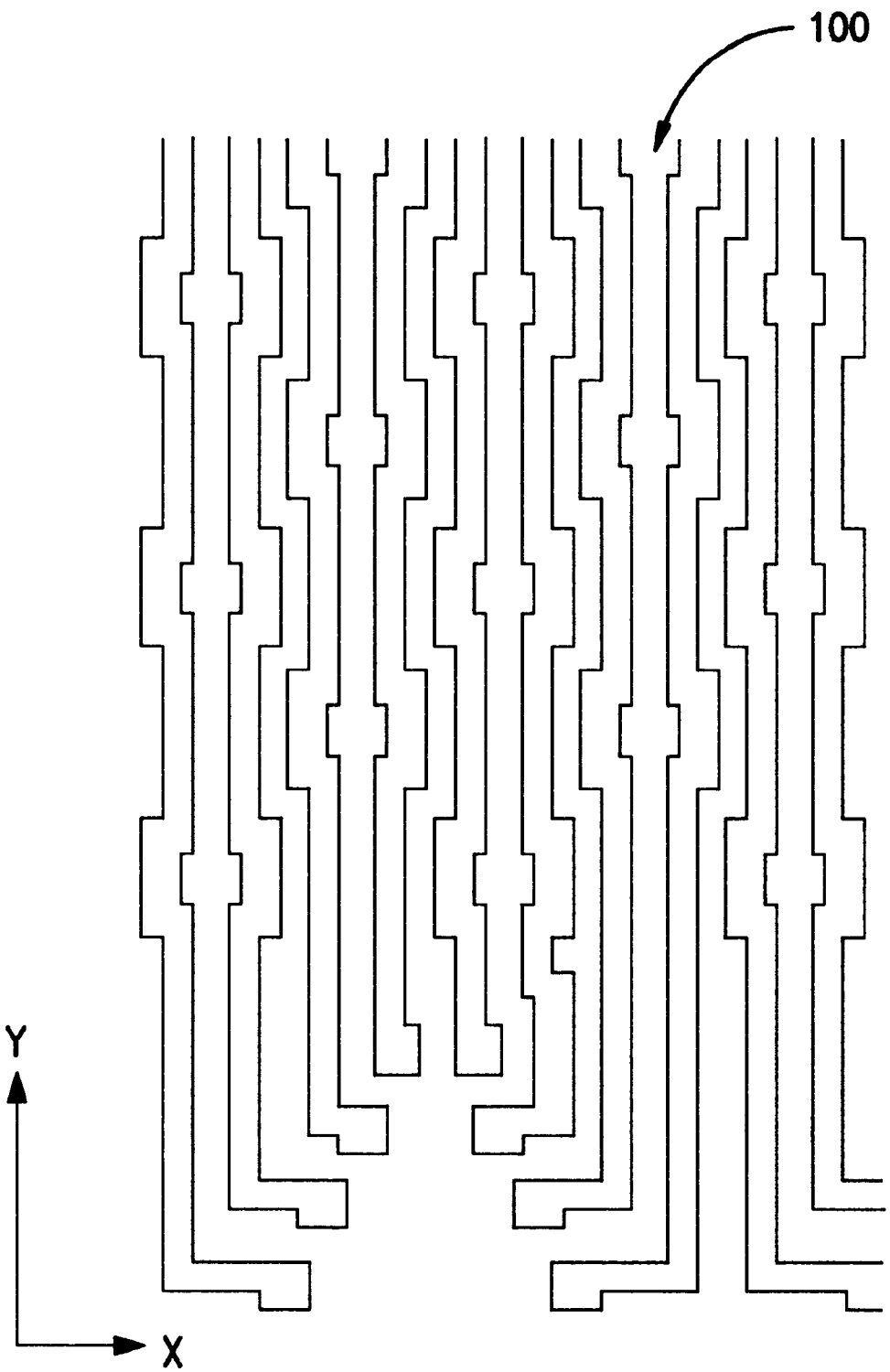
FIG. 3 is a diagrammatic view illustrating a pattern to be transferred to a specimen.
Figure 4:
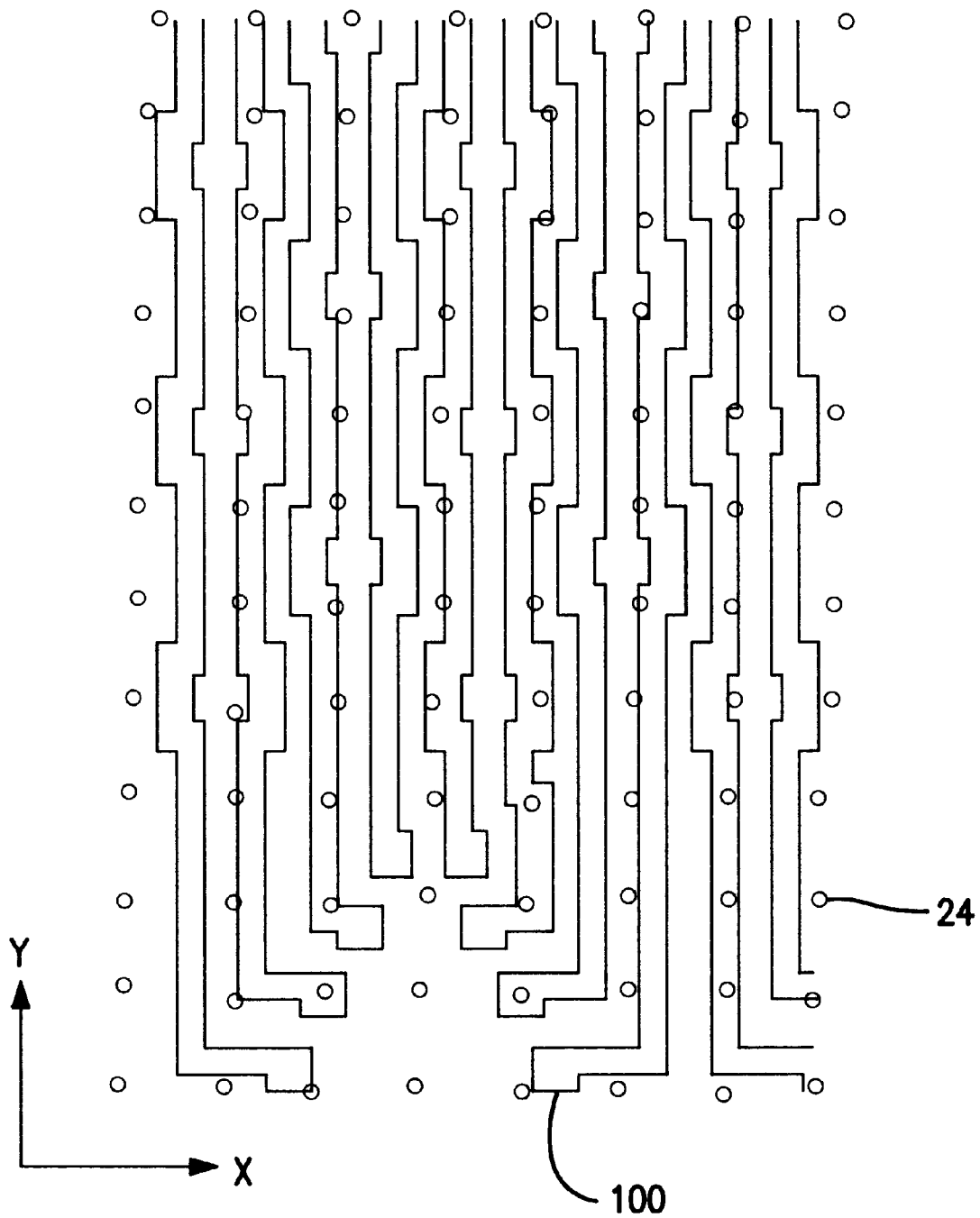
FIG. 4 is a diagrammatic view illustrating a relationship between an array of electron emitting elements of the electron beam emitting apparatus and a drawn pattern.

FIG. 3 is a diagrammatic view illustrating a pattern 100 to be transferred to a specimen, and FIG. 4 is a similar view but illustrating a positional relationship between the array of the electron emitting elements 24 of the electron emitting apparatus 1 and the pattern 100.

Transfer of the pattern 100 shown in FIG. 3 to the specimen 7 using the electron beam exposure apparatus will be described below.

First, the pattern 100 indicated by solid lines in FIG. 4 is part of the pattern 100 of FIG. 3. Thus, when the stage 8 on which the specimen 7 is placed continuously moves in the Y direction, if the central position of any electron emitting element passes a portion which has not been exposed with the pattern, a voltage is applied to this electron emitting element 24 so as to successively draw the pattern 100.

In this instance, since the axis of the arrangement of 40 elements of the array of the electron emitting elements 24 is not orthogonal to but is inclined a little with respect to the axis of the arrangement of 100 elements so that the projection positions on the axis of the arrangement of 100 elements may be spaced by 0.025 $\mu$m from each other as described hereinabove with reference to FIG. 1(B), if the stage 8 is moved in a direction orthogonal to the axis of the arrangement of 100 elements of the array of the electron emitting elements 24 while a voltage is applied periodically to the electron emitting elements 24, then electrons are irradiated as trains of 40×100 spots, that is, 4,000 spots, at equal distances of 0.025 $\mu$m individually in lines between the width of the arrangement of 100 elements, that is, within the width of 100 $\mu$m. Consequently, the overall width of 100 $\mu$m is irradiated upon by the spots.

Further, stage position measurement element 9 of FIG. 1(A) has a length measuring function which makes use of laser interference, and is so programmed that those of the electron emitting elements 24 to which a voltage is to be applied are selectively determined based on data of the stage position measurement element 9 by the timing adjustment element 10. The laser elements are shown as $9_x$ and $9_y$ for x and y dimension measurements respectively.

Then, the stage 8 is moved stepwise by 100 $\mu$m in the X direction, and drawing for each successive region is successively performed successively moving the stage 8 in the Y direction as described above, thereby performing exposure for the entire desired pattern.

By providing a power supply to be applied to the 100×40, that is, 4,000, electron emitting elements 24, dividing pattern data into rectangular regions of the width of 100 $\mu$m and programming so as to detect whether or not a pattern is present in a very small unit region obtained by dividing data in each rectangular region in units of 0.025 $\mu$m in such a manner as described above, drawing for a fixed region can be performed in an equal exposure time irrespective of a type of a pattern or presence or absence of a repetitive pattern.

As described above, according to the present invention, since an electron beam exposure apparatus is constructed such that it includes an electron emitting apparatus having a large number of very small electron emitting openings formed at a very fine pitch in a matrix of rows and columns therein, a control power supply for applying an electron excitation voltage to arbitrarily selected ones of the electron emitting elements in the electron emitting openings independently of each other, and a timing adjustment element for adjusting the timing at which the electron excitation voltage is to be applied based on stage position data and that position coordinates of those of the electron emitting elements to which the electron excitation voltage is to be applied are programmed in advance and the electron emitting apparatus is operated based on the program, exposure for a region of a fixed area can be performed in an equal exposure time a pattern of whichever type is included in a pattern to be drawn and irrespective of presence or absence of a repetitive pattern. As a result, there is an advantage that exposure for the pattern to be drawn can be performed in a short time.

Further, with the present invention, since electron optical microcolumns need not be formed and individual electron beams are used always on the positions on an axis of an electron optical system using the acceleration electrode and the converging electrode which have openings corresponding to the positions of the individual electron emitting elements of the electron emitting apparatus, an electron optical system of a particularly high degree of accuracy comparing with conventional electron beam exposure apparatus is not necessitated. Further, a structure which is compact and high in stability comparing with conventional electron optical columns can be employed, and accordingly, there is another advantage that, while pattern exposure of a high degree of accuracy is possible, the cost for the apparatus can be reduced comparing with conventional apparatus.

Further, in the embodiment described above, it is programmed by the timing adjustment element that those of the electron emitting elements to which a voltage is to be applied are selectively determined based on data of the stage position measurement element having a length measuring function which makes use of laser interference. The laser length measuring function can measure the position of the stage with a tolerance of 0.01 $\mu$m or less, and since the positional relationships between the positions of the stage and the individual electron emitting elements are always fixed, there is a further advantage that the positions on a specimen exposed with electron beams emitted from the individual electron emitting elements are controlled accurately with a degree of accuracy substantially equal to the degree of accuracy of the laser length measuring function.

What is claimed is:

1. An electron beam exposure apparatus for patterning integrated circuits, comprising:

an electron emitting apparatus including an extracting electrode in the form of a flat plate and a plurality of electron emitting elements having end portions exposed individually in a plurality of first openings formed in rows and columns on a principal face of said extracting electrode;

a control power supply for applying a voltage between said extracting electrode and selected ones of said electron emitting elements so that electrons are emitted independently of each other from the selected electron emitting elements in a fixed pattern during patterning of integrated circuits;

an acceleration electrode in the form of a flat plate having a number of second openings equal to the number of and corresponding to said electron emitting elements for accelerating the emitted electrons, said second openings being of substantially equal size to said first openings; and a converging electrode in the form of a flat plate having a number of third openings equal to the number of and corresponding to said electron emitting elements for converging electron beams formed from the accelerated electrons, said third openings being of substantially equal size to said second openings, wherein said extracting electrode, said acceleration electrode and said converging electrode are spaced apart from each other by air gaps substantially occupying the space between said electrodes designed and adapted so that the emitted electrons from each said electron emitting elements is in a fixed spot image.

2. An electron beam exposure apparatus as claimed in claim 1, wherein said control power supply includes a plurality of application power supplies individually corresponding to said plurality of electron emitting elements, and voltages are applied from selected ones of said application power supplies to the selected ones of said electron emitting elements.

3. An electron beam exposure apparatus as claimed in claim 1, wherein said acceleration electrode in the form of a plate in which said second openings through which electron beams pass is disposed parallel to said extracting electrode.

4. An electron beam exposure apparatus as claimed in claim 1, wherein an axis of a column of the arrangement of said electron emitting elements and an axis of a row of the arrangement of said electron emitting elements are non-orthogonal relative to each other, and a stage disposed in an opposing relationship to said extracting electrode for carrying a specimen thereon is moved in a direction orthogonal to one of the axis of a column and the axis of a row of the arrangement of said electron emitting elements.

5. An electron beam exposure apparatus as claimed in claim 4, further comprising a timing adjustment element for adjusting a timing at which the voltage is to be applied to said selected ones of said electron emitting elements, based on the position of said stage.

6. An electron beam exposure apparatus as claimed in claim 5, further comprising a stage position measurement element for measuring the position of said stage, said timing adjustment element adjusting a timing at which the voltage is to be applied based on measurement data from said stage position measurement element.

7. An electron beam exposure apparatus for patterning integrated circuits, comprising:

an electron emitting apparatus including an extracting electrode in the form of a flat plate, a plurality of electron emitting elements having end portions exposed individually in a plurality of first openings, and a plurality of pads, said electron emitting elements being individually connected to said pads via wiring lines and contacts, a control power supply for applying a voltage between said extracting electrode and selected ones of said electron emitting elements so that electrons are emitted independently of each other from the selected electron emitting elements during patterning of integrated circuits;

an acceleration electrode in the form of a flat plate having a number of second openings equal to the number of and corresponding to said electron emitting elements for accelerating the emitted electrons, said second openings being of substantially equal size to said first openings; and a converging electrode in the form of a flat plate having a number of third openings equal to the number of and corresponding to said electron emitting elements for converging electron beams formed from the accelerated electrons, said third openings being of substantially equal to said second openings, wherein said extracting electrode, said acceleration electrode and said converging electrode are spaced apart from each other by air gaps substantially occupying the space between said electrodes.

8. The electron beam exposure apparatus of claim 1, wherein said first openings are approximately 0.5 μm in diameter, said first openings are arranged in said rows and said columns are at a pitch of 1.0 μm.

9. The electron beam exposure apparatus of claim 1, wherein said second openings are less than 1.0 μm in diameter.

10. The electron beam exposure apparatus of claim 9, wherein said second openings are tapered, and said acceleration electrode is disposed such that a smaller diameter side of said second openings is closest to said lead electrode.

11. The electron beam exposure apparatus of claim 4, wherein each of said plural electron emitting elements irradiates as a spot image having a diameter of approximately 0.025 μm on said specimen.

12. An electron beam exposure apparatus for patterning semiconductor devices during manufacture comprising:

an electron emitting apparatus comprised of a flat plate having a plurality of first openings formed in rows and columns on said flat plate wherein an axis of a row of first openings and an axis of a column of first openings are non-orthogonal to each other, and a plurality of individually controllable electron emitting elements having end portions exposed individually in said first openings for providing electrons to selectively irradiate portions of a semiconductor specimen during manufacture;

an acceleration electrode opposing and spaced apart from said extracting electrode by an air space and comprised of a flat plate having second openings located in correspondence to said first openings;

a converging electrode opposing and spaced apart from said acceleration electrode by an air space and comprised of a flat plate having third openings located in correspondence to said second openings wherein said first, second, and third openings are designed and adapted so that the emitted electrons from said electron emitting apparatus is in a fixed spot image.

13. The electron beam exposure apparatus of claim 12, wherein said acceleration electrode is positioned approximately 4 mm apart and parallel to said extracting electrode, and said converging electrode is positioned approximately 1 mm apart and parallel to said acceleration electrode so that electrons emitted from said electron emitting apparatus are accelerated by said acceleration electrode and then converged by said converging electrode so that said electrons are irradiated as spot images on a specimen.

14. The electron beam exposure apparatus of claim 13, wherein said acceleration electrode and said converging electrode are each comprised of a 1 mm thick stainless steel plate.

* * * * *